United States Patent
Bevis

(10) Patent No.: US 6,886,153 B1
(45) Date of Patent: Apr. 26, 2005

(54) DESIGN DRIVEN INSPECTION OR MEASUREMENT FOR SEMICONDUCTOR USING RECIPE

(75) Inventor: Christopher F. Bevis, Los Gatos, CA (US)

(73) Assignee: KLA-Tencor Corporation, San Jose, CA (US)

(*) Notice: Subject to any disclaimer, the term of this patent is extended or adjusted under 35 U.S.C. 154(b) by 0 days.

(21) Appl. No.: 10/029,521

(22) Filed: Dec. 21, 2001

(51) Int. Cl.[7] .............................................. G06F 17/50
(52) U.S. Cl. ........................ 716/19; 716/4; 716/21
(58) Field of Search ................................ 356/237, 394; 716/4, 19, 21, 20; 700/121; 382/149

(56) References Cited

U.S. PATENT DOCUMENTS

| | | | | |
|---|---|---|---|---|
| 5,127,726 A | * | 7/1992 | Moran | 356/237 |
| 5,940,300 A | * | 8/1999 | Ozaki | 700/121 |
| 6,252,412 B1 | | 6/2001 | Talbot et al. | |
| 6,388,747 B1 | * | 5/2002 | Nara et al. | 356/394 |
| 2002/0165636 A1 | * | 11/2002 | Hasan | 700/121 |

OTHER PUBLICATIONS

SPIE Handbook of Microlithography, Micromachining and Microfabrication, vol. 1: Microlithography [online], [retrieved on Nov. 29, 2001] Retreived from <URL: http://www.cnf.cornell.edu/SPIEBook/spie9.htm.
Operations Manual for Model F5, KLA–Tencor Corp., Chapters 3, 4: Creating and Editing Recipes, Manual: 04–0452A, Dec. 1998, pp. 3–1 to 4–44.
Operations Manual for Model AIT, KLA–Tencor Corp., Chapters 4,5: Creating Recipes, #530131–36 Rev. A 4/99, pp. 77–144.

* cited by examiner

*Primary Examiner*—Thuan Do
(74) *Attorney, Agent, or Firm*—Fenwick & West LLP

(57) ABSTRACT

Design driven inspection/metrology methods and apparatus are provided. A recipe is a set of instructions including wafer processing parameters, inspection parameters, or control parameters for telling an inspection/metrology system how to inspect/measure a wafer. Design data is imported into a recipe extraction system that recognizes instances of target structures and configures recipe parameters accordingly, thereby reducing manual instrument setup time, improving inspection/measurement accuracy, and improving fabrication efficiency.

23 Claims, 12 Drawing Sheets

Overlay Recipe Example

| Recipe Item | Overview | Method | |
|---|---|---|---|
| Alignment Sites | Look by name for structures from list of known good site types and locate instances at about 3 O'clock and 9 O'clock | 1. | Search for structure types in GDS file to locate appropriate structures. |
| | | 2. | Determine location of sites relative to die origin. |
| | | 3. | Determine locations on wafer from list of die origins in stepper setup file and offsets from die origin. |
| | | 4. | Choose those closest to 3 and 9 O'Clock. |
| Measurement Sites | Look for overlay measurement sites close to the locations for a 9 site pattern | 1. | Search for structure types in GDS file to locate appropriate structures. |
| | | 2. | Determine location of sites relative to die origin. |
| | | 3. | Determine locations on wafer from list of die origins in stepper setup file and offsets from die origin. |
| | | 4. | Choose those closest to 9 site pattern locations. |
| Measurement Info | Determine algorithm based on measurement site type | 1. | Determine site type by name in GDS file. |
| | | 2. | Use lookup table to determine algorithm. |
| Target Value | Determine target value from geometry information for measurement site | 1. | Use geometry information in GDS file to derive target value. |

905 — Alignment Sites
910 — Measurement Sites
915 — Measurement Info
920 — Target Value

FIG. 9

Inspection Recipe Example

| Recipe Item | Overview | Method |
|---|---|---|
| Alignment Sites | Look by name for structures from list of known good site types and locate instances at about 3 O'clock and 9 O'clock. | 1. Search for structure types in GDS file to locate appropriate structures.<br>2. Determine location of sites relative to die origin.<br>3. Determine locations on wafer from list of die origins in stepper setup file and offsets from die origin.<br>4. Choose those closest to 3 and 9 O'Clock. |
| Machine setup | Determine appropriate gain and laser power from process level. | 1. Determine process level from mask level name.<br>2. Use lookup table to determine laser power and gain. |
| Region based thesholding | Identify areas where high sensitivity is possible ( such as highly periodic region and open areas ) based on the pattern expected on the wafer and set thresholds for that region appropriately. Similarly, estimate the achievable sensitivity for each region of similar makeup. | 1. Determine array regions by looking for array statements in GDS file.<br>2. Determine open areas by generating estimated image on wafer.<br>3. Set thresholds for these regions appropriately.<br>4. Duplicate over all die using info from stepper setup file. |
| PSF (programmable spatial filter in detector fourier plane) setup | Use expected wafer image to generate optimal PSF settings. | 1. Generate expected Image on wafer from GDS file.<br>2. Perform fourier transform on image.<br>3. Generate PSF pattern settings based on peaks in fourier transform. |

1105 → Alignment Sites
1110 → Machine setup
1115 → Region based thesholding
1120 → PSF

FIG. 11

DESIGN DRIVEN INSPECTION OR MEASUREMENT FOR SEMICONDUCTOR USING RECIPE

TECHNICAL FIELD

This invention relates generally to inspection or metrology systems and, more particularly, to design driven semiconductor wafer defect inspection or metrology.

BACKGROUND

Inspection and metrology technologies are conventionally used in semiconductor fabrication facilities for material monitoring, disposition, yield prediction, and yield management. Wafers are inspected at various stages of production using both in-line and off-line processes. Measurement and inspection instruments conventionally require manual interaction for setting up recipes for the instrument.

Conventional methods for setting up instrument recipes are tedious, error prone, time consuming, and often result in less than ideal data. For example, a typical method requires a human being to draw rectangles or complex polygons by hand on the instrument interface using a mouse or trackball. Another method is for a human being to "mark" the corner of a device feature in the live video image from the measurement instrument microscope and drive the physical stage of the instrument to the next "measurement site" in the x or y direction to enclose the rectangle for inspection (measurement) inclusion or exclusion.

Current techniques for instrument setup can take anywhere from minutes to several hours and impact the available time an instrument can be used "in production," which can also affect downstream process tools waiting for a specific measurement—impacting the efficiency of the entire fabrication facility.

What is therefore needed are systems and methods that improve inspection or metrology instrument performance and reduce the manual interaction required to setup an instrument to improve the precision, accuracy, and efficiency of the fabrication facility.

SUMMARY OF THE INVENTION

An embodiment of the present invention provides a method for importing a partial or complete pre-existing design file (e.g., GDS2, GDS2 derivative, or equivalent file or data type) and using the content of this file or data to identify and include and/or exclude portions of the complete "die" or series of die (device under inspection) for measurement. Design data is translated or otherwise mapped to the coordinate system of the inspection or measurement instrument allowing specification of, for example, what is and what is not to be measured or inspected, where measurements are to be taken, what features or structures are to be used for alignment.

The disclosed method and apparatus reduces instrument setup times by analyzing an integrated circuit (IC) design file (gds2, a gds2 derivative, or equivalent data type) directly, indirectly, or translated (including all x,y coordinates of the design features) to produce a format readable by the inspection/metrology instrument. The coordinate system of the measurement instrument and the design data are aligned or mapped, allowing use of targets, structures, features, areas, or regions, etc., from the design information.

Embodiments of the invention significantly reduce the setup times required to define these targets, structures, features, areas, or regions, for measurement or inspection, and to increase the value of the measurement or inspection in terms of material disposition and/or yield performance predictivity.

In an embodiment of the invention, the user inputs the contents of a file into the inspection/metrology device. This process can be completely automated using conventions that allow an inspection/metrology system to download the appropriate data days before or just prior to run time thereby improving the cycle time and overall efficiency of the fabrication facility. The implications on productivity, of not only the measurement systems but all systems downstream of the measurement systems, are profound. The total cost of the capital equipment set of an IC fabrication plant can easily be hundreds of millions of dollars (and increasing dramatically at the 300 mm node) with incremental productivity gains of a few percent having tremendous return on the depreciation costs of the equipment set and overall efficiency and throughput (run rate) of the facility.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 9 is a table showing an example of an overlay recipe extraction according to embodiments of the present invention;

FIG. 11 is a table showing an example of an inspection recipe extraction according to embodiments of the present invention.

DETAILED DESCRIPTION

The present invention now will be described more fully with reference to the accompanying figures, in which several embodiments of the invention are shown. The present invention may be embodied in many different forms and should not be construed as limited to the embodiments set forth herein. Rather these embodiments are provided so that this disclosure will be thorough and complete and will fully convey the invention to those skilled in the art. In this disclosure, embodiments include inspection or metrology instruments and inspection and metrology instruments. The term inspection/metrology is generally used throughout to encompass each of these embodiments.

Figure 1:
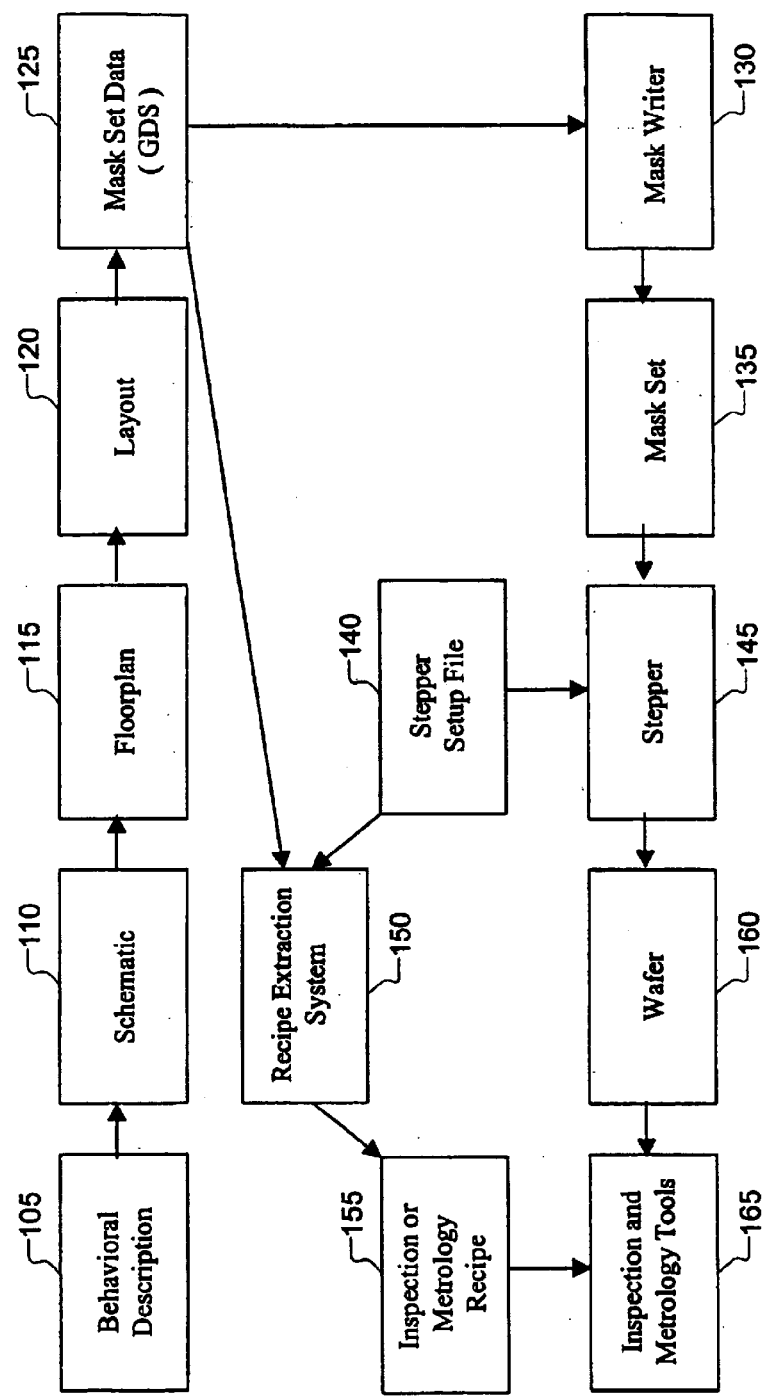
FIG. 1 is a block diagram of information flow according to an embodiment of the present invention.

FIG. 1 is a block diagram of information flow according to an embodiment of the present invention. In the illustrated embodiment, behavioral description 105, schematic 110, floorplan 115, and layout 120 are used in the design flow for generating mask set data 125. Behavioral description 105 is code written in, e.g., Verilog, VHDL (Very High Speed Integrated Circuit (VHSIC) Hardware Description Language), or other description language. Schematic 10 is produced from behavioral description 105 by automated or manual techniques, e.g., synthesis or schematic capture. Floorplan 115 represents the overall topology of a design, relative placement of, e.g., modules, global busses, and clocks. Layout 120 describes the geometric representation of, e.g., modules and devices. Mask set data 125 is preferably a file in GDS2 format that represents layout 120. One skilled in the art will appreciate that other design data formats can be implemented, e.g., GDS, GDS2 derivative, CATS, or equivalent file or data type. Mask set data 125 optionally includes designer intent information derived directly or indirectly from behavioral description 105, schematic 110, floorplan 115, layout 120, or other parts of the design information flow. One skilled in the art will appreciate that each of, e.g., behavioral description 105, schematic 110, and floorplan 115 need not be used in producing mask set data 125.

From mask set data 125, mask writer 130 produces mask set 135 using techniques known to those skilled in the art. Stepper setup file 140 defines how stepper 145 exposes wafer 160 for a given mask in mask set 135. Stepper setup file 140 includes, e.g., focus and exposure settings, blading, and die placement data. Recipe extraction system 150 performs analysis to recognize regions or target areas from mask set data 125. In an embodiment of the present invention, recipe extraction system 150 uses die placement data from stepper setup file 140 in conjunction with at least a portion of mask set data 125 to generate inspection/metrology recipe 155. A recipe is a set of instructions including wafer processing parameters, inspection parameters, or control parameters for telling an inspection/metrology system how to inspect/measure a wafer. In another embodiment of the present invention, recipe extraction system 150 performs analysis using behavioral description 105, schematic 110, floorplan 115, layout 120, or other design data. For example, recipe extraction system 150 uses specifications for the process and analyzes a layout 120 data file, rather than mask set data 125 in preferably GDS2 format.

Mask set data 125 is a partial or complete pre-existing design file (e.g., GDS2, GDS2 derivative, CATS, or equivalent file or data type). Further details of mask set data 125 are discussed below and with reference to FIG. 6. Table 1 lists examples of the types of information available from mask set data 125. Recipe extraction system 150 is preferably implemented by software code executing on a general-purpose computer, but can be implemented in, e.g., a special-purpose computer, or hardware. Further details of the recipe extraction processes and apparatus are provided throughout this disclosure. Inspection/metrology recipe 155 contains at least information that inspection/metrology tools 165 need for running the appropriate inspection/metrology tests on a wafer at a given process level. Inspection/metrology recipe 155 preferably contains data required for each of several inspection/metrology instruments as is typically used in semiconductor fabrication. For example, inspection instruments available from KLA-Tencor Corp. of San Jose, Calif. include patterned wafer micro inspection station (model 2139), patterned wafer macro inspection station (model 2430), and patterned wafer darkfield inspection station (model AIT III). Metrology instruments-also available from KLA-Tencor Corp. of San Jose, Calif. include film measurement tool (model F5), critical dimension measurement tool (model 8450 CD SEM), and overlay measurement tool (model Archer 10).

TABLE 1

Alignment sites, targets, or structures
Inspection areas (regions of the device to be inspected); masked areas (regions of the device NOT to be inspected)
Measurement sites, targets, or structures
Regions of uniform makeup, material, density, and topography
Critical measurement sites, targets, or structures that have a direct bearing on device performance
Cell-to-cell calculation targets or areas
Regions identified for cell-to-cell inspections
Reticle identification sites
Critical Dimension measurements sites, targets, and structures
Film measurement targets, sites, and critical areas for measurement
Registration sites, structures, and targets for determining layer-to-layer overlay measurements, tolerances, and errors By way of further example, several embodiments are now described for various inspection/metrology testing operations.

Device Inspection

Optical, electron beam, x-ray, or other inspection systems acquire information from mask set data 125 either directly or indirectly, or through translation of the design data in inspection/metrology recipe 155, with or without employing a computer for translation. The acquired information includes, for example alignment sites, targets, or structures, inspection areas (regions of the device to be inspected), masked areas (regions of the device NOT to be inspected), or regions of uniform or non-uniform makeup, material, density, and topography for the purpose or region based processing, cell-to-cell calculation targets or areas, regions identified for cell-to-cell inspections or other types of inspection, or regions, sites, structures, or areas associated with specific illumination conditions (light level boxes, filters, polarization states, spatial filter calculations, light stops, etc) or collection channels including filters, polarization states, aperture settings, etc., including structures whose critical measurement may have a direct bearing on understanding eventual device performance, etc.

Critical Dimension Measurement

Optical, electron beam, x-ray, or other critical dimension (CD) measurement systems acquire information from mask set data 125 including alignment sites, targets, or structures, critical dimension measurement sites, targets, or structures including structures whose critical measurement and analysis may have a direct bearing on understanding eventual device performance, etc.

Overlay Measurement

Optical, electron beam, x-ray, or other overlay measurement systems acquire information from mask set data 125 including alignment sites, targets, or structures, registration sites, structures, and targets for determining layer-to-layer overlay measurements, tolerances, and errors, including structures whose critical measurement and analysis may have a direct bearing on understanding eventual device performance, etc.

Film Measurement

Optical, electron beam, x-ray, or other film measurement systems acquire film measurement targets, sites, and structures, including structures whose critical measurement and analysis may have a direct bearing on understanding eventual device performance, etc.

For example, with further reference to FIG. 1, a film thickness test is described. Recipe extraction system 150 reads mask set data 125 to identify regions on the wafer that have the appropriate film structures for a given measurement. In another embodiment, a three-dimensional representation of film structure is used to identify film measurement regions. Additionally, designer intent, target sites, critical areas, or instances of named structures present in the design data may be used in the analysis process. Stepper setup file 140 is then integrated with mask set data 125 to translate the coordinate system and determine die placement on the wafer for the identified uniform areas. Inspection/metrology recipe 155 is created to instruct the film measurement instrument to test appropriate areas of the wafer for film thickness.

Figure 2:
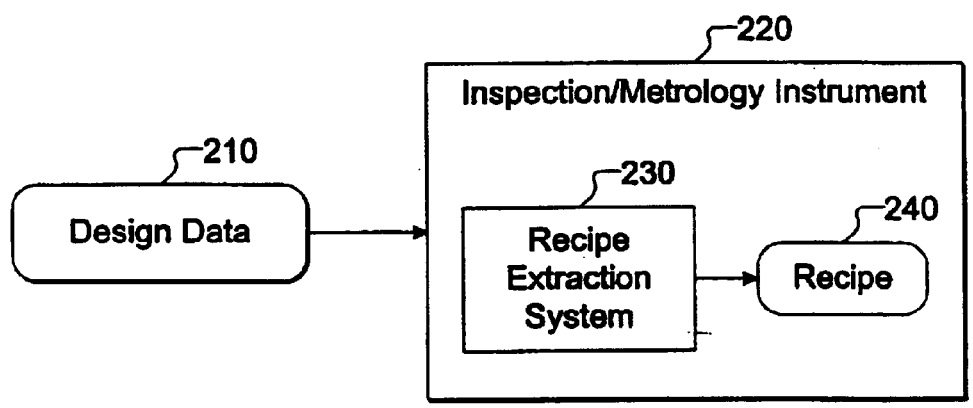
FIG. 2 is a block diagram of a design driven inspection/metrology system according to an embodiment of the present invention.

FIG. 2 is a further block diagram of a design driven inspection/metrology system according to an embodiment of the present invention. In the illustrated embodiment, design data 210 is imported to inspection/metrology instrument 220. Design data 210 includes mask set data 125 (FIG. 1) and, optionally, data from stepper setup file 140. Among other functional units and data collection tools (not shown in FIG. 2), inspection/metrology instrument 220 comprises an integrated recipe extraction system 230 and corresponding recipe 240. Recipe extraction system 230 performs the particular analysis on design data 210 that is required to generate recipe 240 appropriate for inspection/metrology instrument 220. That is, for a given inspection/metrology test, a particular subset of design data 210 may be relevant. For example, design data 210 preferably includes information relating to the multiple layers of the production process. Inspection/metrology instrument 220 can, for example, require information about regions of a particular layer of design data 210. Recipe extraction system 230, therefore, performs the particular analysis required for inspection/metrology instrument 220. Recipe extraction system 230 eliminates or reduces the need for manual instrument time, thereby improving the productivity and availability of the tool for "in-line," repetitive, unique, or sequenced "production," measurements, and other types of measurements supporting the engineering and production activities associated with a fabrication line.

Figure 3:
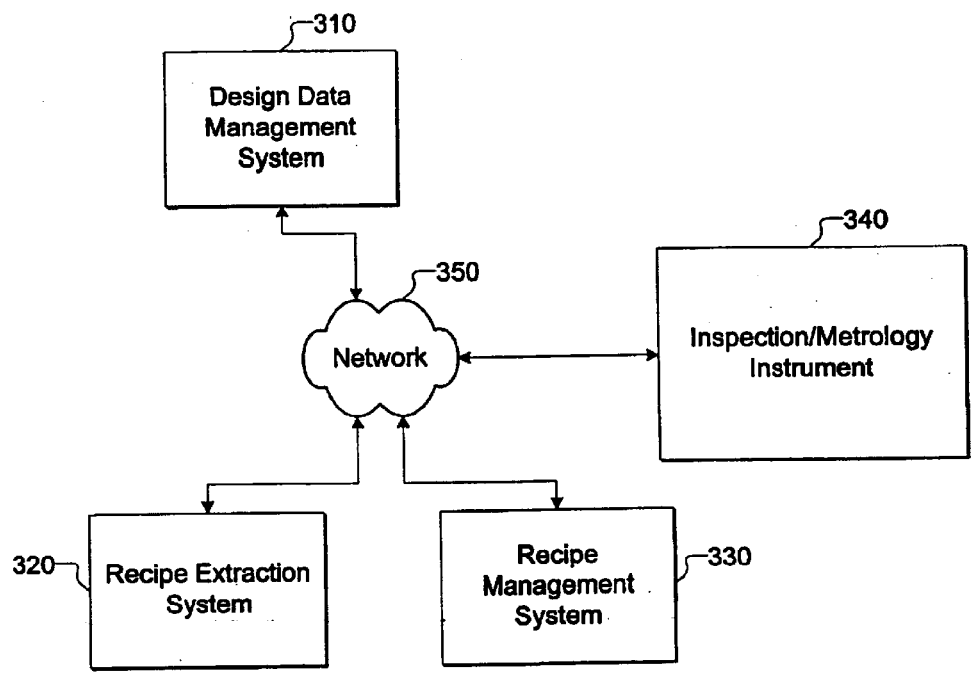
FIG. 3 is a design driven inspection/metrology architecture including a network according to an embodiment of the present invention.

FIG. 3 is a design driven inspection/metrology architecture including a network according to an embodiment of the present invention. Design data management system 310, recipe extraction system 320, recipe management system 330, and inspection/metrology instrument 340 are operatively coupled via network 350. In a preferred embodiment, network 350 is a local area network running a switched ethernet protocol. Of course, other types of networks including metropolitan, wide area, or wireless networks may be used.

Design data management system 310 is preferably a file library of mask set data. Of course, design data management system 310 can also be a database or other appropriate data store. Design data management system 310 includes design data representing, for example, a plurality of layers of an integrated circuit layout, a plurality of devices, schematic data, layout verification data, and designer intent data. In addition to the data types just enumerated, one skilled in the art will appreciate that design data management system 310 can store or retrieve any type of data used in the design process. Recipe extraction system 320 preferably interfaces with at least design data management system 310 and recipe management system 330. Recipe extraction system 320 retrieves and processes design data from design data management system 310. In a preferred embodiment, recipe extraction system 320 produces recipes that are stored in recipe management system 330. Inspection/metrology instrument 340 retrieves recipes appropriate for a single test or suite of tests from recipe management system 330. One skilled in the art will appreciate that although a single inspection/metrology instrument is illustrated in FIG. 3, several such instruments can be coupled via network 350 or other networks (not shown).

Design data management system 310 enables "off-line" (i.e., not on a specific, physical inspection or measurement system) interaction with design data which improves the productivity of "on-line" in-fab inspection and measurement systems. The design driven data inspection/metrology is dramatically faster and more accurate because the operation is preferably software driven, thereby eliminating manual interaction with physical stages and the associated errors. A direct translation of the coordinates are selected and used at the "micro" level rather than a manual, macro-level interaction with trackballs, mouses, stages, display devices, etc. Moreover, in an embodiment, this process can be automated for specific layers (or content) of the design data (e.g., GDS2 file or equivalent data files or types) greatly simplifying setup and improving the productivity of all downstream process systems which may be dependent upon the results of these inspection and measurement systems.

The architecture illustrated in FIG. 3 provides several benefits. Recipe management system 330 performs central storage and/or delivery functions that make the availability, translation, and integration of these design data types more accessible to the inspection/metrology systems. Furthermore, a single setup session, including one to many design layers, allows identifying inspection areas and measurement points within the device for a wide variety of measurement and inspection systems-thereby streamlining the process for a variety of measurements simultaneously. Throughput (run rate) of the inspection/metrology device is improved by generally reducing the inspected or measured area to that which is of the highest value, thereby reducing the processing overhead (and run rate) of the inspection/metrology system. By reducing the data to only that which is directly relevant to a specific layer or layers, the quality and accuracy of the data is increased for the purpose of material disposition and predicting yield or eventual device performance. Table 2 includes examples of inspection/metrology instrument performance improvements at several measurement points in the fabrication process.

TABLE 2

| | |
|---|---|
| Region Based Multi-thresholding (RBMT) | Resolution is limited by the patience of the applications engineer (or customer) to go through the process of drawing multiple boxes on the instrument interface during setup. An embodiment of the invention allows setting up at full resolution (of the design data) for any given layer without the necessity of manually manipulating the data, i.e., only inspecting the contacts or vias of a specific step. This is of higher value than inspecting regions that do not impact the performance or yield of the device at that step and reduces the time it takes to define this |

TABLE 2-continued

| | |
|---|---|
| | information. |
| Segmented Auto-Thresholding (SAT) | Template performance is improved if the acquired raw data is only from specific portions on the design (i.e., only the contacts, or only the polysilicon lines). |
| Recipe Automation | Recipes are automated with an instrument or recipe management system acquiring the appropriate layer information from the design file well ahead of material arriving for measurement at any given step in the fabrication process potentially even before start material is introduced into a fabrication facility for a given IC design/product. |
| Post Processing | Reporting of defects for critical areas within a specific layer of a device allows for improved yield predictivity and "kill ratio" calculations for yield predictivity and inline device performance monitoring. Image processing algorithms, including automated defect classification, can be used in conjunction with design information to provide additional precision and resolution to results. |
| "Cell-to-cell" Setup | The design data for a given memory cell device allows optimizing "cell size teach" offline. |

Figure 4:
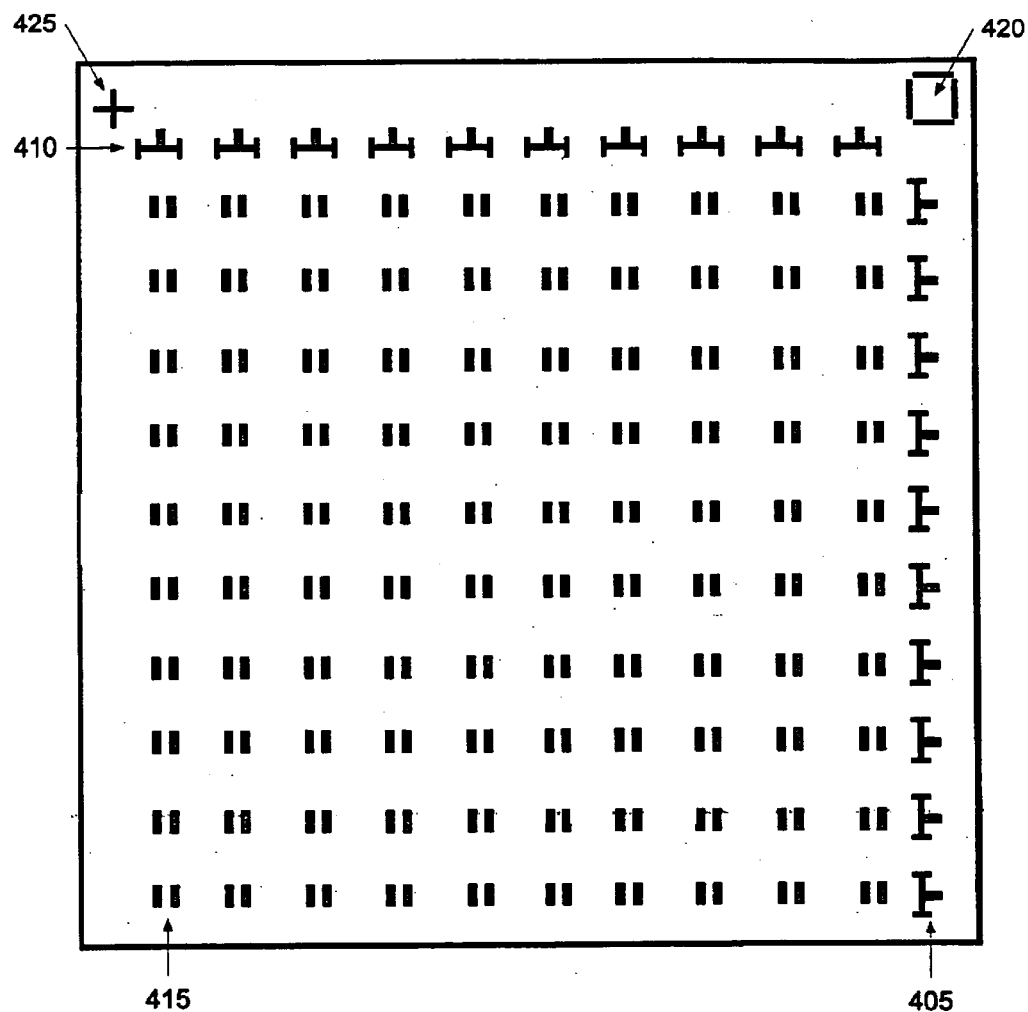
FIG. 4 is an example of a simplified mask image.

FIG. 4 is an example of a simplified mask image. FIG. 4 illustrates several elements, such as, row driver array 405, column driver array 410, DRAM (dynamic random access memory) cell array 415, overlay target 420, and alignment site 425 at a particular process level. Table 3 is a simplified mask set data description corresponding to the mask image of FIG. 4.

TABLE 3

| | | Mask data | |
|---|---|---|---|
| Instance Type | Element Name | Origin | Pitch |
| Array[1,10] | Row Driver | (50 $\mu$m, 25 $\mu$m) | (0 $\mu$m, 5 $\mu$m) |
| Array[10,1] | Column Driver | (50 $\mu$m, 25 $\mu$m) | (5 $\mu$m, 0 $\mu$m) |
| Array[10,10] | DRAM Cell | (25 $\mu$m, 25 $\mu$m) | (5 $\mu$m, 5 $\mu$m) |
| Instance | Overlay Target | (60 $\mu$m, 0 $\mu$m) | |
| Instance | Alignment Site | (0 $\mu$m, 0 $\mu$m) | |

In a preferred embodiment of the present invention, element names and instance types in the design data are used for identifying, e.g, repetition, target areas, and other items listed in Table 1. Further details of identifying structures are discussed below and with reference to FIGS. 9 and 11. In another embodiment, pattern recognition is used for identifying inspection or metrology items, such as those listed in Table 1.

Figure 5:
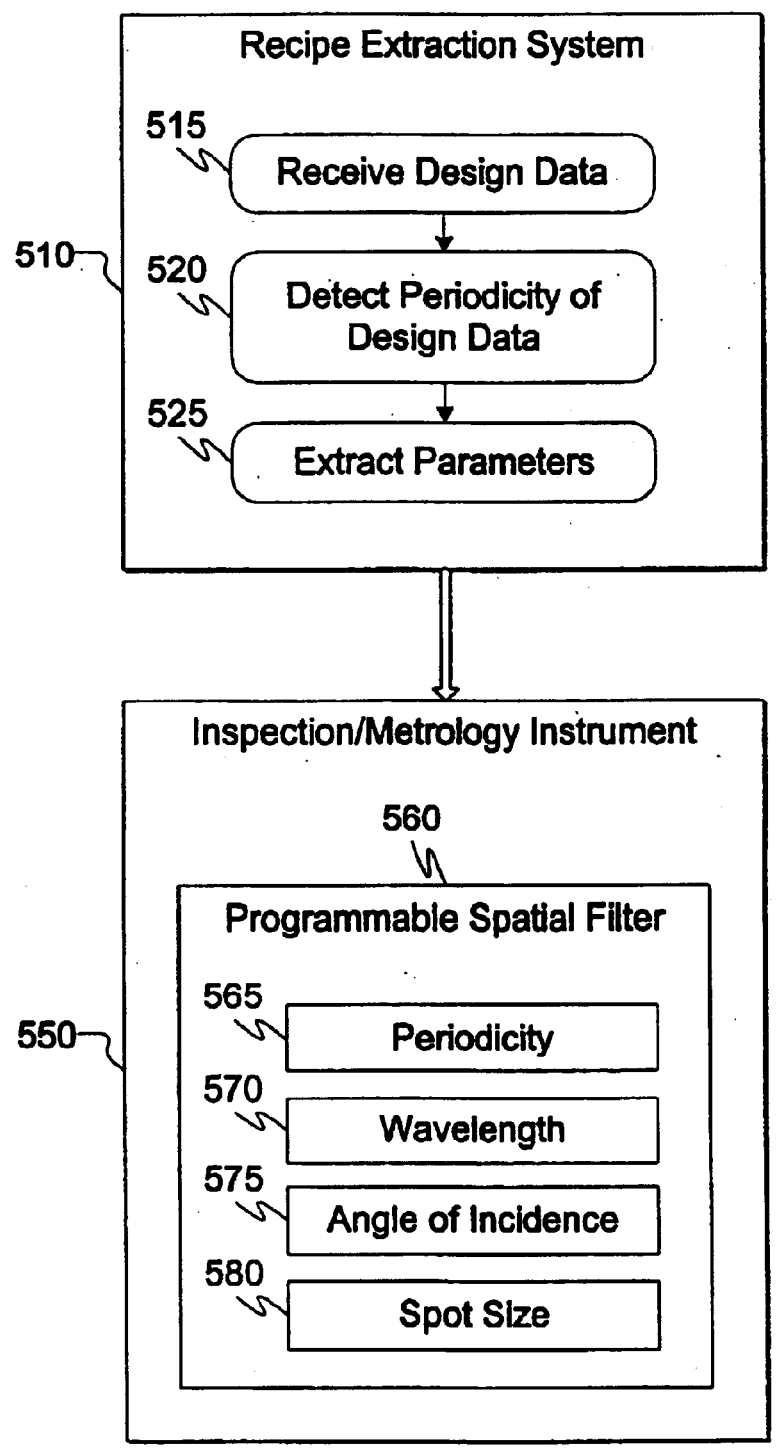
FIG. 5 is a block diagram illustrating a design driven inspection/metrology flowchart according to an embodiment of the present invention.

FIG. 5 is a block diagram illustrating a design driven inspection/metrology flowchart according to an embodiment of the present invention. In the illustrated embodiment, design data is used for configuring a spatial filter. Recipe extraction system 510 performs steps 515, 520, and 525. In step 515, design data is received or read into the analyzer. In step 520, a Fourier analysis is used to find the periodicity of the design data. One skilled in the art will appreciate that other mathematical methods can be used to detect and to map regions of periodic data. In step 525, parameters are extracted from the design data. Parameters include, for example, recipe items and machine setup items. In the illustrated embodiment, an object of extracting parameters is determining the spatial filter configuration.

Recipe extraction system 510 communicates with inspection/metrology instrument 550. Recipe extraction system 510 optionally produces a recipe (not shown) that can be used "off-line," i.e., data analysis is completed before inspection/metrology instrument 550 is ready for testing instructions. In the illustrated embodiment, inspection/metrology instrument 550 performs a test requiring spatial filtering of a collector to remove scatter from repetitive patterns, further increasing signal-to-noise on critical defects. Programmable spatial filter 560 includes parameters of periodicity 565, wavelength 570, angle of incidence 575, and spot size 580. Periodicity 565 is derived from step 520 of recipe extraction system 510. Wavelength 570, angle of incidence 575, and spot size 580 are illumination parameters known to inspection/metrology instrument 550. The use of design data, therefore, automates the programming of a spatial filter.

Figure 6:
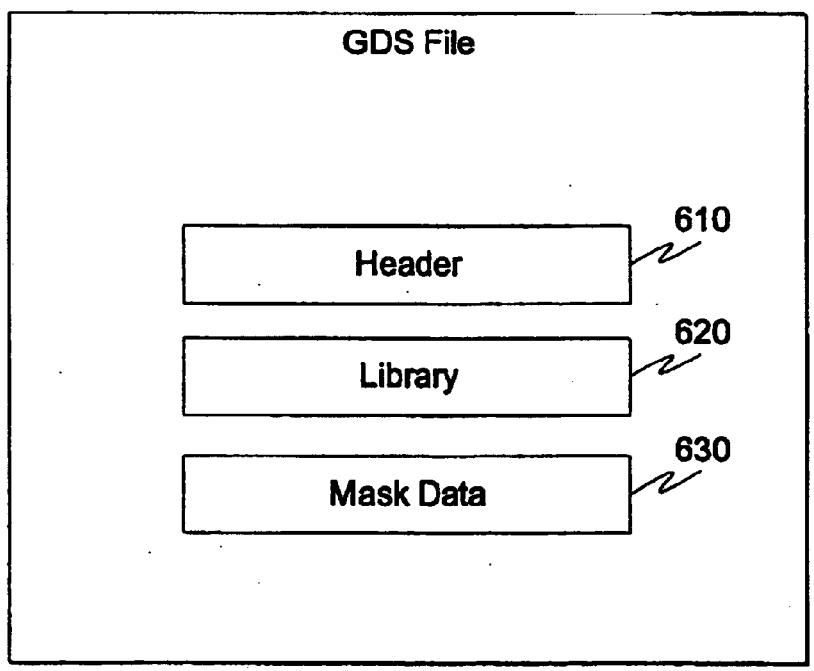
FIG. 6 is a block diagram of a GDS data structure.

FIG. 6 is a block diagram of a GDS file structure. GDS files describe the images on each mask of a mask set. As illustrated in FIG. 6, a GDS file has at least a header 610, library 620, and mask data 630. Header 610 includes, e.g., information on die size. Library 620 includes named definitions of macros for each type of element as a set of polygons. Mask data 630 includes locations on the mask of elements defined in library 620. Objects in library 620 are assigned to layers that correspond to wafer processing steps. Table 4 is an ASCII representation of an example GDS data file.

TABLE 4

HEADER
3
BGNLIB
96
2
2
14
1
37
96
2
2
14
1
37
LIBNAME EXAMPLELIBRARY
GENERATIONS
3
UNITS
1.0000000000000E−03
1.0000000000000E−09
BGNSTR
96
2
2
14
1
0
96
2
2
14
1
17
STRNAME EXAMPLE
BOUNDARY
LAYER
1
DATATYPE
0
XY
−10000
10000
20000
10000
20000
−10000

TABLE 4-continued

```
            -10000
            -10000
            -10000
            10000
            ENDEL
            ENDSTR
            ENDLIB
```

Figure 7:
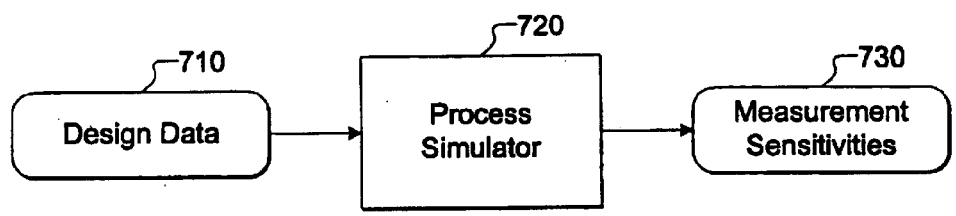
FIG. 7 is a block diagram design of driven process simulation according to an embodiment of the present invention.

FIG. 7 is a block diagram of design driven process simulation according to an embodiment of the present invention. In this embodiment, design data 710 is input to process simulator 720 to produce measurement sensitivities 730. Process simulator 720 simulates the physical parameters of design data 710 at various stages in the fabrication process and creates corresponding measurement sensitivities. For example, process simulator 720 can create measurement sensitivities based on the design data and properties of how a polysilicon line should appear on a wafer in a given process step. Determining appropriate measurement sensitivities for each test of an inspection/metrology system can completely automate the wafer monitoring and inspection process, thereby increasing fabrication throughput. Process simulator 720 is preferably software available from Synopsys, Inc. of Mountain View, Calif. One skilled in the art will appreciate that any software or hardware that simulates wafer processing would be appropriate.

In another embodiment, multiple layers of design data (e.g., gds2, gds2 derivative, or equivalent file or data type) are used to simulate device structure for the purposes of inspection/metrology device optimization. That is, analysis of design data may incorporate components of structure rendering or simulation to provide analysis that can be used, for example, to optimize data collection by the inspection/metrology instrument. Further, inspection/metrology instruments can include image analysis and automatic defect classification based on, for example, targets, structures, or features referenced from the design data. In a preferred embodiment, a combination of yield or device performance feedback is used in conjunction with design data to determine critical inspection/metrology structures or areas which then drive the optimization of the inspection/metrology instrument for improved performance.

Figure 8:
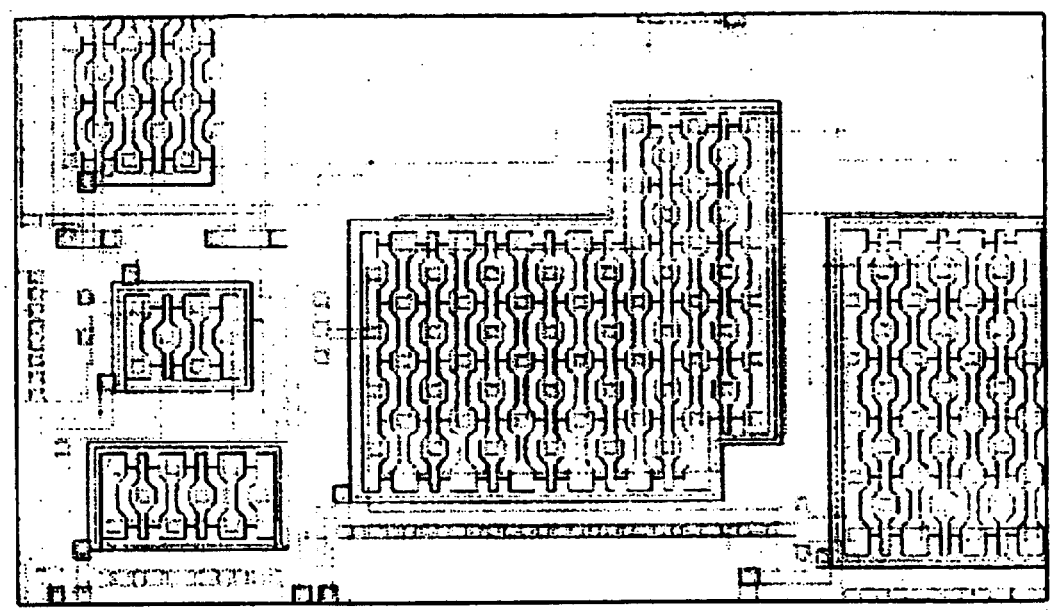
FIG. 8 is an example of a design layout illustrating several features.

FIG. 8 is an example of a design layout illustrating several features. FIG. 8 illustrates a device with multiple layers of design information. The design data analysis processes and apparatus described herein use one or more of these layers to extract parameters and generate recipes for inspection/metrology instruments. Elimination of extraneous device features (noise sources) allows focusing measurements or inspections on those structures that have the most value for the specific layer (or layers) under measurement or inspection. For example, for a given inspection test, the specific patterns and geometries in the contact layer data may be most relevant. Thus using one or more layers of design data reduces setup definition and programming times, and increases the accuracy of collected data or defect classification.

FIG. 9 is a table showing an example of an overlay recipe extraction according to embodiments of the present invention. In FIG. 9, methods are described for extracting recipe items including alignment sites, measurement sites, measurement info, and target value. The illustrated alignment sites method 905 is now described in further detail. Alignment sites are preferably used to setup properly coordinates to drive to measurement sites. In step 1, the mask set data is searched for structure types. Structure types include named alignment site elements (e.g., 425, FIG. 4), any structure specifically or empirically found useful for alignment, or pattern recognition of alignment targets. In step 2, the locations of the alignment structures are determined relative to die origin. In step 3, the locations of the alignment structures are translated to locations on the wafer using, e.g., a stepper setup file. In step 4, the locations closest to the 3 o'clock and 9 o'clock positions (1010, FIG. 10) are preferably selected. Opposite ends of the wafer are preferably used for alignment sites, although one skilled in the art will appreciate that other locations may be selected.

In overlay metrology, measurement sites 910 are used to determine the degree to which one layer aligns with prior process steps. Measurements are preferably made using the conventional 9 site pattern to determine variation across the wafer. As illustrated in FIG. 9, step 1 of extracting a measurement site recipe is searching mask set data for structure types. Structure types include named overlay targets (e.g., 420, FIG. 4), specific devices or transistors, or other structures useful for overlay measurement. In step 2, the locations of the measurement sites are determined relative to die origin. In step 3, the locations of the measurements sites are translated to locations on the wafer using, e.g., a stepper setup file. In step 4, the locations closest to the 9 site pattern (1020, FIG. 10) are preferably selected. In another embodiment, several locations (e.g, one to five) are selected on a given die for measuring the same type of device. For example, designer intent can be used to identify a critical structure that is measured in several locations on a given die or across the wafer.

For other measurement site types, measurement information 915 is extracted. In a preferred embodiment, site types are identified by name in the mask set (design) data. In another embodiment, pattern recognition is used to identify site types. Once identified, a lookup table or database is used to determine the measurement strategy and corresponding recipe data In some cases, knowledge of the desired shape of a structure is necessary to select the magnification of an optical system or the algorithm to be used in analyzing the data to produce a measured data value. A target value 920 is determined from geometry information for a measurement site. In some cases, the overlay value on a transistor structure accommodates the fact that the desired location of the source or drain structures are not intended to be centered on the transistor's active region. A method for extracting target value recipe information includes using the geometry data from the mask set data to derive target value.

Figure 10:
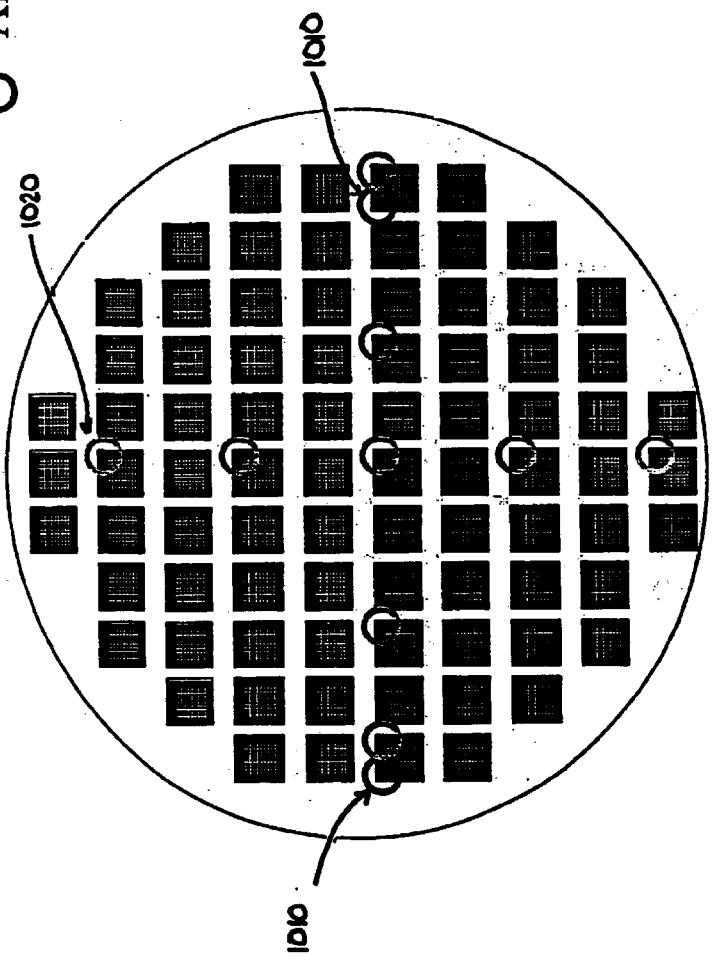
FIG. 10 is an example of a simplified wafer image illustrating alignment sites and measurement sites according to embodiments of the present invention.

FIG. 10 is an example of a simplified wafer image illustrating alignment sites and measurement sites according to embodiments of the present invention. Alignment sites 1010 are used to setup coordinates for precise location of measurement sites. Alignment sites 1010 are illustrated in the 3 o'clock and 9 o'clock positions on the wafer. One skilled in the art will appreciate, however, that alignment sites are typically on opposite ends of the wafer but can be selected from a plurality of appropriate locations and structures. Measurement sites 1020 are used to determine the degree to which one layer aligns with prior process steps. FIG. 10 illustrates a 9 site pattern that is distributed across the wafer. Distributed measurement patterns are used for determining variations across the wafer.

FIG. 11 is a table showing an example of an inspection recipe extraction according to embodiments of the present invention. In FIG. 11, methods are described for extracting recipe items including alignment sites, machine setup, region based thresholding, and programmable spatial filter setup. The illustrated alignment sites method 1105 is now described in further detail. Alignment sites are preferably used to setup properly coordinates to drive to inspection sites. In step 1, the mask set data is searched for structure types. Structure types include named alignment site elements (e.g., 425, FIG. 4), any structure specifically or empirically found useful for alignment, or pattern recognition of alignment targets. In step 2, the locations of the alignment structures are determined relative to die origin. In step 3, the locations of the alignment structures are translated to locations on the wafer using, e.g., a stepper setup file. In step 4, the locations closest to the 3 o'clock and 9 o'clock positions (1010, FIG. 10) are preferably selected. Opposite ends of the wafer are preferably used for alignment sites, although one skilled in the art will appreciate that other locations may be selected.

Machine setup recipe extraction 1110 is now described based on the example illustrated in FIG. 11. Process level data are those parameters that change from process level to process level in a given product. Process level data describes, e.g., registration, alignment, data collection, exclusion, and inspection criteria. In step 1, the process level is determined from the mask level name in the mask set data One skilled in the art will appreciate that other strategies exist for determining the process level, such as, directly encoding a process level ID (identifier) or mask ID in the mask set data. In step 2, a lookup table or database is used to determine, e.g., laser power and gain. For each process layer, a lookup table includes parameters and corresponding values. Example parameters include data collection channel selection, illumination polarization, APS (automatic positioning system) reflectivity, gain/sensitivity, variable aperture stop, collection polarization, contrast, and other parameters used in the processing of the acquired data either in software or hardware. One skilled in the art will appreciate that the APS is an opto-electronic system that servos the height of the wafer during scanning. In an alternate embodiment, analysis of the expected structures on the wafer determined by process simulation are used in place of the lookup table to determine appropriate machine setup parameters. Process simulation is described above and with respect to FIG. 7.

Region based thresholding 1115 is preferably used to increase defect capture where there are distinct scattering differences in differentiating specific regions of a device; that is, embedded cache in logic devices, bus versus array in memory devices, or embedded memory devices. Mask set data is used to identify areas where high sensitivity is achievable based on the pattern expected on the wafer and to set thresholds accordingly. As illustrated in the example of FIG. 11, step 1 is to determine array regions by looking for array instances in the mask set data. Step 2 is to determine open areas by generating estimated image on wafer. Step 3 is to set threshold for these areas accordingly. In step 4, the thresholds are duplicated over all die using stepper setup file information. One skilled in the art will appreciate that this method can be used to estimate the achievable sensitivity for each region of similar makeup by searching mask set data for named instances or performing pattern recognition.

Programmable spatial filter (PSF) settings 1120 can be extracted to generate optimal suppressing of pattern and increase defect capture. In step 1, an expected wafer image is generated from mask set data. Next, in step 2, a Fourier transform is performed on the image using conventional techniques. In step 3, PSF pattern settings are generated based on peaks in the Fourier transform. Further detail on PSF settings is described above and with reference to FIG. 5.

Figure 12:
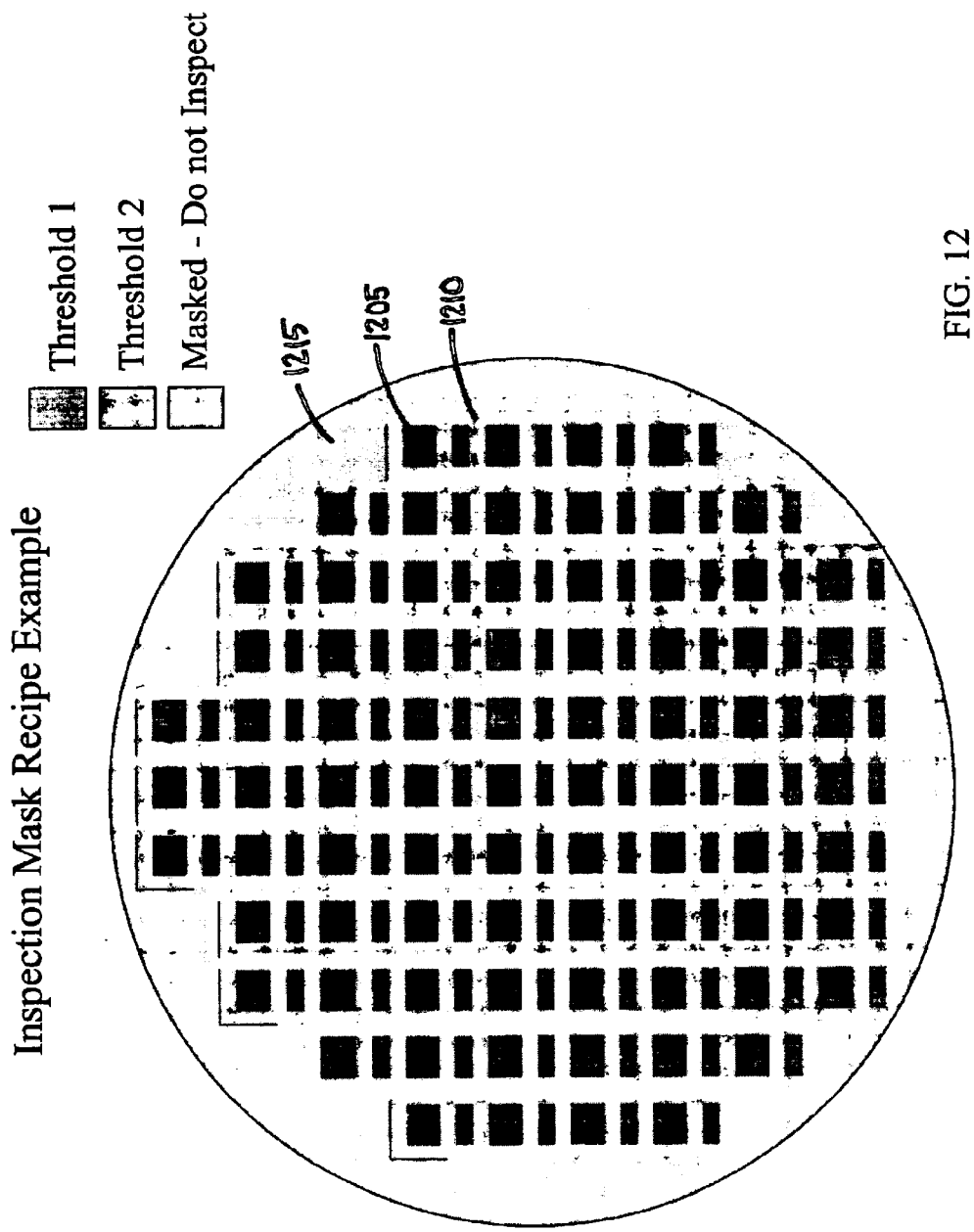
FIG. 12 is an example of a simplified wafer image illustrating inspection thresholds according to an embodiment of the present invention.

FIG. 12 is an example of a simplified wafer image illustrating inspection thresholds according to an embodiment of the present invention. Threshold 1 (1205), threshold 2 (1210), and masked 1215 regions are illustrated. As discussed above and with respect to FIG. 11, separate thresholds are defined for regions of different background noise levels within a die. The use of at least threshold 1 (1205) and threshold 2 (1210) optimizes defect capture in complex designs. Masked region 1215 is a region that is not inspected. The use of masked region 1215 improves the throughput of an inspection/metrology instrument by reducing the inspected or measured area to that of the highest value.

Having described preferred embodiments of design driven inspection/metrology (which are intended to be illustrative and not limiting), it is noted that modifications and variations can be made by persons skilled in the art in light of the above teachings. It is therefore to be understood that changes may be made in the particular embodiments of the invention disclosed that are within the scope and spirit of the invention as defined by the appended claims and equivalents.

What is claimed is:

1. For an instrument responsive to recipe parameters, a method for creating a recipe, the method comprising:
   accessing mask set data;
   recognizing a target structure in the mask set data;
   extracting parameters from the mask set data; and
   configuring the recipe based on the extracted parameters responsive to the recognized target structure, wherein the configuration of the recipe is performed before a wafer printed with a mask created from the mask set data is generated.

2. The method of claim 1 wherein the parameters for a process layer are queried from a database.

3. The method of claim 1 wherein the extracted parameters comprises at least one of wafer processing parameters, inspection parameters, and control parameters.

4. The method of claim 1 wherein the target structure comprises at least one of alignment site, measurement site, overlay target, and array element.

5. For an instrument instructed by a recipe to perform a task on a wafer, a method comprising:
   receiving design data describing a die;
   extracting parameters from the design data relevant to the configuration of the instrument; and
   creating from the extracted parameters, the recipe for performing the task, wherein the recipe is created before a wafer to which the design data has been applied is generated.

6. The method of claim 5 wherein the task includes at least one of inspection and metrology.

7. The method of claim 5 further comprising applying the extracted parameters to at least one die on the wafer using a stepper setup file.

8. The method of claim 5 wherein the design data includes at least one of element names and instance types.

9. The method of claim 5 further comprising inspecting the wafer using the recipe.

10. The method of claim 9 wherein the inspecting is micro inspection.

11. The method of claim 9 wherein the inspecting is macro inspection.

12. The method of claim 9 wherein the inspecting is darkfield inspection.

13. The method of claim 5 further comprising measuring the wafer using the recipe.

14. The method of claim 13 wherein the measuring is film measurement.

15. The method of claim 13 wherein the measuring is critical dimension measurement.

16. The method of claim 13 wherein the measuring is overlay measurement.

17. A recipe extraction system using design data specifying one or more die, the system comprising:
- an access module to access the design data describing a die;
- an analyzer to extract parameters from the design data; and
- a configuration module to produce a recipe for controlling one of an inspection and a metrology instrument, wherein the configuration module produces the recipe before a wafer to which the design data has been applied is generated.

18. The system of claim 17 wherein the access module is a network interface.

19. The system of claim 17 wherein the analyzer performs overlay recipe extraction.

20. The system of claim 17 wherein the analyzer performs inspection recipe extraction.

21. The system of claim 17 wherein the recipe is a set of instructions for measuring a wafer.

22. The system of claim 17 wherein the recipe is a set of instructions for inspecting a wafer.

23. An inspection/metrology instrument using design data specifying one or more die, the instrument comprising:
- an input interface for accessing the design data describing a die;
- an analyzer to recognize target structures in the design data and extract parameters from the design data; and
- a recipe module creating a recipe based on the extracted parameters responsive to the recognized target structure, wherein the recipe module creates the recipe before a wafer to which the design data has been applied is generated.

* * * * *

UNITED STATES PATENT AND TRADEMARK OFFICE
CERTIFICATE OF CORRECTION

PATENT NO. : 6,886,153 B1
DATED : April 26, 2005
INVENTOR(S) : Christopher F. Bevis It is certified that error appears in the above-identified patent and that said Letters Patent is hereby corrected as shown below:

Column 12,
Line 37, please change "comprises" to -- comprise --.

Signed and Sealed this

Twentieth Day of September, 2005

JON W. DUDAS
*Director of the United States Patent and Trademark Office*